United States Patent [19]

Kase et al.

[11] 3,821,650

[45] June 28, 1974

[54] PHASE LOCK LOOP ELECTRONIC TUNING SYSTEM

[75] Inventors: Kiyoshi Kase, Tokyo; Shikun Kyu, Yokohama, both of Japan

[73] Assignee: Motorola, Inc., Franklin Park, Ill.

[22] Filed: Jan. 26, 1973

[21] Appl. No.: 326,845

[52] U.S. Cl. .......... 325/423, 329/122
[51] Int. Cl. .......... H04b 1/16
[58] Field of Search .......... 325/329, 330, 331, 418, 325/419, 420, 421, 422, 423, 433; 173/7.3 DC, 5.8 F; 329/122, 124

[56] References Cited

UNITED STATES PATENTS

| | | | |
|---|---|---|---|
| 2,698,904 | 1/1955 | Hugenholtz | 325/419 |
| 2,817,755 | 12/1957 | Koch | 325/420 |
| 3,461,388 | 8/1969 | Daley | 325/419 X |
| 3,611,152 | 10/1971 | Sakai | 325/421 |

Primary Examiner—Benedict V. Safourek
Attorney, Agent, or Firm—Mueller, Aichele & Ptak

[57] ABSTRACT

A superheterodyne television receiver is disclosed with a phase lock loop tuning system for providing completely electronic and automatic tuning of the receiver. The voltage controlled oscillator of the tuner is controlled by a tuning voltage obtained from a phase detector responsive to the video carrier frequency at the IF amplifier output and a reference frequency obtained from a stable reference oscillator. Provision is made for breaking the loop when it is desired to change channels to force the tuning voltage to be selectively driven upward or downward until the next channel is reached whereupon the system resets automatically. The phase lock loop from the IF amplifier output then once again is resumed to maintain tuning to the newly selected channel.

8 Claims, 7 Drawing Figures

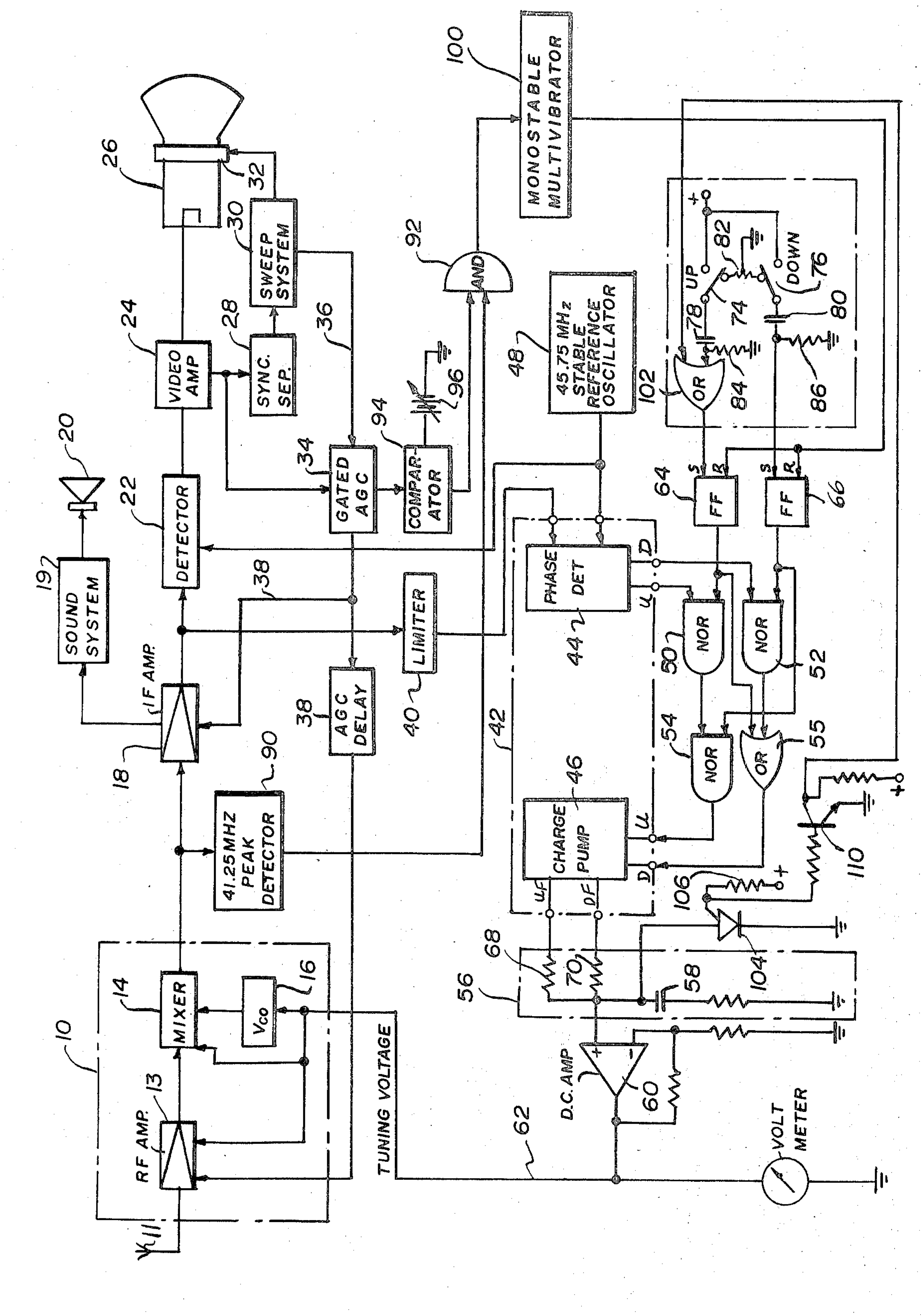
MONOSTABLE MULTIVIBRATOR
AND
SWEEP SYSTEM
SYNC. SEP.
VIDEO AMP
COMPAR-ATOR
GATED AGC
DETECTOR
SOUND SYSTEM
I.F. AMP.
LIMITER
AGC DELAY
45.75 MHz STABLE REFERENCE OSCILLATOR
PHASE DET
OR
NOR
FF
UP
DOWN
CHARGE PUMP
41.25MHZ PEAK DETECTOR
MIXER
Vco
RF AMP.
TUNING VOLTAGE
D.C. AMP
VOLT METER

PHASE LOCK LOOP ELECTRONIC TUNING SYSTEM

BACKGROUND OF THE INVENTION

The development of varactor diodes has resulted in the development of all-electronic varactor tuners for use in television receivers. Such turners are attractive since they permit the same type of tuning for both the VHF and UHF channels of a television receiver. Varactor tuner designs, however, generally do not take full advantage of the characteristics of the varactor diode since the tuning voltages for the varacter diodes are applied by a station selector in an open loop system. This results in a relatively complicated and expsnsive tuner. For example, in the case of preset tuning voltages representative of the various television channels which are to be selected, many voltage sources in the form of preset potentiometers are provided. These sources then are switched into the control circuit for the varactor diode tuner much in the same manner as the fixed inductors are preset and switched in conventional mechanical tuners.

Some automatic nonmemory electronic tuning systems have been developed in which a tuning voltage is swept automatically, and a holding circuit then is provided to hold the tuning voltage level for as long as required. Generally the holding circuits for these electronic circuits have proven to be unsatisfactory in operation or they are quite complicated and expensive. In addition, the drift problem of an open loop electronic tuner is well-known.

In an open loop varactor tuner the temperature drift of the varactor oscillator (the local oscillator of the tuner) is caused both by the drift of the varactor oscillator circuit itself and also by the variation of the tuning voltage with respect to temperature. As a consequence, it generally is necessary to provide a further automatic adjustment of the tuning voltage by an additional automatic fine tuning system employing an AFT or AFC discriminator responsive to the IF amplifier output to develop a correction voltage applied to the varactor oscillator in addition to the tuning voltage.

It is desirable to obtain a reliable, uncomplicated, all-electronic tuning system capable of operation in all of the television signal bands as well as for a radio tuner.

SUMMARY OF THE INVENTION

It is an object of this invention to provide an improved frequency selecting system.

It is an additional object of this invention to provide an improved tuning system for a superheterodyne receiver.

It is a further object of this invention to use a phase locked loop tuning system for stable and accurate frequency selection.

It is yet another object of this invention to use a phase locked loop system which searches and holds tuning of a superheterodyne receiver automatically.

In accordance with a preferred embodiment of this invention, the tuning of a superheterodyne receiver is effected by a voltage controlled oscillator having a tuning voltage applied to it. This tuning voltage is obtained in a phase lock loop from the output of a phase detector which is supplied with first and second input signals, one of which is obtained from a stable reference oscillator and the other of which is the IF carrier frequency obtained from the output of the IF amplifier of the receiver. The phase lock loop including the phase detector circuit then operates to maintain the IF carrier frequency locked in phase and frequency with the reference frequency from the stable source to maintain accurate tuning.

To change the tuning of the receiver to a different station, a gating circuit is provided to permit selective breaking of the loop between the output of the phase detector and the voltage controlled oscillator and to selectively cause the tuning voltage to be swept either upwardly or downwardly until the next station is properly tuned. This is ascertained by an automatic gain control voltage obtained from the output of the IF amplifier. The presence of a gain control voltage of a predetermined magnitude is used to reset the system, reestablishing the original phase lock loop between the phase detector and the voltage controlled oscillator.

BRIEF DESCRIPTION OF THE DRAWING

The sole drawing of this application is a circuit diagram, partially in block form, of a preferred embodiment of the invention.

DETAILED DESCRIPTION

Referring now to the drawing, there is shown a superheterodyne television receiver which may be either a black and white or a color television receiver. Incoming signals are applied to a tuning stage 10 of the receiver from an antenna 11. The tuning stage 10 includes the usual RF amplifier 13, a mixer 14, and also includes a voltage controlled oscillator 16 which supplies the local oscillator signals to the mixer 14 for the purpose of tuning the receiver to the desired one of the many incoming signals available to the antenna 11. The output of the mixer 14 is applied to a conventional F amplifier stage 18, which in turn supplies signals to a sound system 19 where they are converted to audio signals and reproduced on loudspeaker 20. The IF amplifier 18 also supplies signals to a video detector 22, illustrated as a synchronous detector. The output of the detector 22 is amplified by a video amplifier stage 24 and supplied to a cathode ray tube 26 which displays the signals as video images.

In addition, there is shown the usual sync separator circuit 28 for separating the synchronizing pulses from the composite signal present at the output of the video amplifier and controlling the operation of a sweep system 30 which supplies the vertical and horizontal sweep signals to a deflection yoke 32 on the cathode ray tube 26.

It is common in television receivers to employ a gated automatic gain control (AGC) for controlling the gain of the IF and RF amplifier stages and such a gated AGC circuit 34 is shown receiving output signals from the video amplifier 24. The gated AGC circuit 34 is controlled or gated by horizontal flyback pulses obtained over a lead 36 from the output of the sweep system 30 and supplies gain control signals over a lead 38 to the IF amplifier stage 18. The gain control signal from the output of the gated AGC circuit 34 also is applied through an AGC delay circuit 38 to the RF amplifier 13 to control the gain of the RF amplifier after a predetermined level of gain control signal is present on the output of the gated AGC circuit. This AGC delay circuit 38 may be of conventional well-known configuration.

The portion of the television receiver which has been described thus far is conventional, and the circuit blocks may take any number of known configurations. Although the television receiver which is illustrated in the drawing is shown as a black and white receiver, the tuning circuit to be described hereinafter also is equally applicable to a color television receiver. The additional chrominance or color processing circuitry for a color television receiver has not been shown in the drawing in an effort to avoid unnecessarily complicating the disclosed circuit. It is important to note, however, that the tuning circuit is not limited to a black and white television receiver but may be used in conjunction with any superheterodyne radio frequency receiver, including color television receivers and radio receivers.

As stated previously, the local oscillator tuning signal which determines the station to which the receiver is tuned is obtained from a voltage controlled oscillator 16. This oscillator produces output signals, the frequency of which are determined by a direct current tuning voltage applied to the oscillator. It is common practice to use varactor diode tuning circuits for such oscillators although other voltage variable tuning elements could be employed.

To maintain proper tuning of the receiver during reception of signals on any channel, the voltage controlled oscillator 16 is controlled by a tuning voltage obtained from a phase lock loop. Since the maintenance of the frequency of the voltage controlled oscillator 16 at some pre-established value is much less important than the maintenance of the correct video carrier frequency at the output of the IF amplifier 18, the IF amplifier output is utilized as the signal representative of the tuning of the receiver for controlling the frequency of operation of the oscillator 16. To do this, a limiter circuit 40 is connected to the output of the IF amplifier and removes the amplitude modulations from the video carrier frequency to provide a substantially square wave signal at its output. This signal is applied to one of two inputs of a phase detector circuit 42 which includes a phase detector portion 44 and a charge pump circuit 46.

The phase detector circuit 42, with the circuit portions 44 and 46, preferably is a digital frequency/phase detector circuit of the type disclosed in Treadway U.S. Pat. No. 3,610,954, issued Oct. 5, 1971. A second input for the phase detector portion 44 is obtained from a stable reference oscillator 48 which provides output signals at 45.75 megahertz (the IF video carrier frequency) to the phase detector portion 44. The phase detector circuit portion 44 generates voltages on a pair of outputs U and D which are indicative of the phase and frequency differences between the two signals applied to its input. The operation of the phase detector portion 44 is described in detail in the abovementioned U.S. Pat. No. 3,610,954 and will not be repeated here.

The output potentials obtained from the two outputs U and D of the phase detector circuit portion 44 are applied to respective inputs of a pair of NOR gates 50 and 52. The output of the NOR gate 52 is applied through an OR gate 55 to the "D" input of the charge pump 46, and the output of the NOR gate 50 is applied to one of two inputs of a NOR gate 54 which has its output connected to the "U" input of the charge pump 46. The letters "U" and "D" are used to designate "up" and "down" in the operation of the tuning system.

The charge pump 46 produces outputs on two outputs "UF"and "DF." These outputs are connected to a low pass filter circuits 56 which includes a charge storage capacitor 58 which stores a charge or voltage corresponding to the tuning voltage to be applied to the voltage controlled oscillator 16 to maintain the video IF carrier frequency at the output of the IF amplifier state 18 at the correct or proper frequency. This voltage is amplified by a DC amplifier 60, the output of which is applied over a lead 62 to the control input of the voltage controlled oscillator 16 as the tuning voltage for the oscillator 16. This tuning voltage also is applied to tuning stages in the mixer 14 and the RF amplifier circuit 13 in a manner which is well-known.

When the frequency of the video carrier at the output of the IF amplifier stage 18 is the same as the frequency of the output of the stable reference oscillator 48, the tuning control voltage supplied to the voltage controlled oscillator 16 is maintained at a stable value to cause the output frequency of the voltage controlled oscillator to maintain this relationship. If the two input signals applied to the phase detector portion 44, however, are not of the same frequency and phase, the control voltage stored in the charge storage capacitor 59 varies or sweeps to cause the tuning voltage to vary in the same manner. This in turn causes the voltage controlled oscillator 16 to sweep in frequency until the conditions are met where the two input signals to the phase detector portion 44 once again are the same. At that time the system will lock in phase and frequency at a point where the IF amplifier video carrier frequency is the same as the frequency of the reference oscillator 48.

As a result of this operation, the phase lock loop frequency selection circuit controlling the voltage controlled oscillator 16 is not affected by frequency drift in the performance of the oscillator 16 with respect to the local oscillator or the station selector. In addition there is no necessity for an external automatic fine tuning (AFT or AFC) circuit because the phase lock loop circuit in and of itself comprises an automatic phase and frequency control system.

Assume that the frequency of the voltage controlled oscillator 16 is proper to establish correct tuning for a given channel. when this occurs, the frequency band of the converted IF signal at the output of the IF amplifier 18 ranges from 41.25 megahertz to 46.5 megahertz and the video carrier is present at 45.75 megahertz. The output of the limiter circuit 40 also is a signal at 45.75 megahertz and is locked in phase and frequency with the output of the reference oscillator 48. Under this condition of operation, both the U and D outputs of the phase detector portion are low causing low inputs to be applied to both of the NOR gates 50 and 52 from the phase detector portion 44. At the same time, each of the other inputs applied to the NOR gates 50 and 52, from a pair of flip-flops 64 and 66 also is low. At the same time, the flip-flop 66 supplied a low input to the NOR gate 54 and the flip-flop 64 supplies a low input to the OR gate 55. The operation of the flip-flops 64 and 66 will be described in further detail subsequently; but for a steady state operation to maintain tuning of the receiver to a particular channel, both of the flip-flops 64 and 65 have the "reset" conditions of operation described immediately above.

With all of the inputs to the NOR gates 50 and 52 low, the outputs of these NOR gates both are high, causing a high input signal to be applied through the OR gate 55 to the D input of the charge pump 46. Since one of the inputs to the NOR gate 54 is high, its output becomes low, resulting in a low input signal applied to the U input of the charge pump 46. Under this condition of the inputs to the charge pump 46, both outputs UF and DF act substantially as open circuits; and no current flows from or into the charge pump. As a consequence, the charge on the capacitor 58 in the low pass filter 56 remains stable, and the tuning voltage on the line 62 is maintained at its previous level with no change in the output frequency of the voltage controlled oscillator 16.

If the output frequency of the oscillator 16 is too low, the IF video carrier frequency of the converted signal is lower than the frequency of the reference oscillator 48. This causes the U output of the phase detector portion 44 to go high while the D output remains low. Thus, the output of the NOR gate 52 remains the same but the output of the NOR gate 50 becomes low, thereby causing the output of the NOR gate 54 to go high. Then, the U and D inputs to the charge pump 46 both are high and the charge pump 46 supplies charging current through a charging resistor 68 to increase the charge on the storage capacitor 58. This in turn raises the tuning voltage at a rate determined by the characteristics of the charging path to cause the frequency of the oscillator 16 to sweep upwardly. At the time the video carrier frequency of the output of the IF amplifier stage 18 once again is equal in phase and frequency to the signal obtained from the output of the reference oscillator 48, both outputs of the phase detector portion 44 again become low and the charge on the capacitor 58 is maintained at the new level to maintain this relationship.

If the frequency of the output signal from the voltage controlled oscillator 16 is too high, the frequency of the converted IF video carrier also is too high, somewhere between 45.75 megahertz and 46.5 megahertz. This causes the D output of the phase detector portion 44 to go high while the U output remains low. When this happens, the output of the NOR gate 52 changes from high to low so that both inputs to the charge pump 46 are low. Under this condition of operation, the output "UF" remains as an open circuit; but a discharge path is provided through the output DF and a discharge resistor 70 to permit the capacitor 58 to discharge through the resistor 70 into the charge pump 46 at a rate determined by the characteristics of the discharge path. This lowers the voltage or charge on the capacitor 58, resulting in a corresponding lowering of the tuning voltage applied to the voltage controlled oscillator 16 to reduce the output frequency of the oscillator 16. Thus, the IF video carrier frequency is reduced at a corresponding rate. When the IF frequency supplied by the limiter 40 to the phase detector 44 is equal in frequency and phase to the frequency of the stable reference oscillator 48, the circuit resumes its initial state, and both outputs of the charge pump 46 are open circuits. The new frequency of the voltage controlled oscillator 16 is maintained by the charge on the capacitor 58.

If all that were to be done was to lock the frequency of the IF amplifier output to a single channel as described above, it can be seen that the gates 50, 52, 54 and 55 and their associated connections could be eliminated. The "U" and "D" outputs of the phase detector portion 44 then could be connected directly to the corresponding inputs of the charge pump 46.

The operation of the circuit just described can also be utilized to effect a sweeping of the frequency of the voltage controlled oscillator 16 to change the tuning of the receiver from one channel or station to another. It is for this purpose that the gates 50, 52, 54 and 55 are used.

To change stations or channels, a pair of simple touch switches 74 and 76 are used to initiate a tuning frequency sweep in the "up" or "down" directions. The switches 74 and 76 may be of any number of different configurations, one of the simplest being a touch switch in which the finger of the operator is used to bridge the open contact shown to couple a source of B+ to the output side of either of the switches. The normal position of operation of these switches is shown in the drawing, so that each of the switches 74 and 76 couples the right-hand end of a corresponding coupling capacitor 78 and 80 to ground potential through a center-tapped resistor 82. The other ends of each of the capacitors 78 and 80 also are connected to ground through resistors 84 and 86, respectively. Thus, with the switches 74 and 76 in the position shown in the drawing, the capacitors 78 and 80 are discharged.

Assume now that the open contacts of the switch 76 are bridged or closed. This causes a positive potential to be applied to the right-hand side of the capacitor 80, which in turn results in the application of a positive pulse to the "set" input of the normally reset flip-flop 66. When this occurs, the flip-flop 66 changes state; and its output goes from low to high. This does not have any effect on the output of the NOR gate 54 which remains low since the upper input to the NOR gate 54 continues to be the high output of the NOR gate 50. The output of the NOR gate 52, however, changes from high to low. This causes the output of the OR gate 55 to become low since the input applied to the other input of the OR gate 55 from the output of the flip-flop 64 remains low at this time.

As a consequence, low inputs are applied to both the D and U inputs of the charge pump 46. This results in a cutting or breaking of the phase lock loop from the phase detector portion 44 to the charge pump 46, so that the circuit reacts as if the frequency of the voltage controlled oscillator 16 was too high. The capacitor 58 commences discharging through the resistor 70 into the charge pump 46 to lower the tuning voltage and consequently to sweep the tuning frequency from the oscillator 16 downwardly. This sweep continues until the flip-flop 66 is reset to its initial condition of operation, thereby permitting control of the phase lock loop once again to be effected by the output of the phase detector portion 44.

To reset the flip-flop 66, it is necessary to detect when the video carrier frequency for the next available channel is properly tuned and present at the output of the IF amplifier stage 18. It also is necessary to distinguish between video carriers and audio carriers in a television circuit to prevent erroneous tuning of the circuit to an audio carrier instead of to the video carrier. To accomplish the resetting of the flip-flop 66 to terminate the sweep of the tuning frequency of the oscillator 16 and further to insure that the resetting only is effected when the receiver is properly tuned to a video carrier, additional circuits are employed.

A 41.25 megahertz peak detector 90 is connected to the output of the mixer 14 to produce an output voltage used to enable an AND gate 92 whenever a carrier signal is present at the 41.25 megahertz frequency (the desired frequency for the audio carrier of a properly tuned television receiver). The other input of the AND gate 92 is obtained from the output of a comparator circuit 94 having one input supplied with a reference voltage from a variable DC potential 96. The other input of the comparator circuit is obtained from the output of the gated AGC circuit 34, and an output pulse is obtained from the comparator 94 whenever the AGC voltage exceeds the threshold established by the potential of the reference source 96. Only when the receiver is properly tuned with a sound carrier at 41.25 megahertz to enable the AND gate 92 and a video carrier of sufficient magnitude is present to provide an output from the comparator 94, are both inputs to the AND gate 92 present. When this occurs, a pulse is obtained from the output of the AND gate 92 to trigger a monostable multivibrator 100. The outut pulse obtained from the multivibrator 100 then is applied to the reset inputs of both of the flip-flops 64 and 66 to reset these flip-flops to their reset state. In such reset state the outputs of the flip-flops are both low. Thus, the system is returned to its original stable state of operation, and control of the phase lock loop again is effected from the output of the phase detector portion 44 to maintain the tuning of the receiver to the new carrier.

If it is desired to retune the receiver to a higher channel or station, the open contacts of the "up" tuning switch 74 are bridged or depressed to apply a positive pulse through an OR gate 102 to the "set" input of the flip-flop 64. This causes the output of the flip-flop 64 to go high, resulting in a high output from the OR gate 55 and simultaneously causing the output of the NOR gate 50 to become low. Both inputs to the NOR gate 54 then are low, so that the U input to the charge pump goes high. This, as described previously, results in a charging current supplied from the charge pump 46 from the output UF through the resistor 68 to the capacitor 58 to increase the charge thereon. The tuning voltage 62 then is swept upwardly to raise the frequency of the output signal from the voltage controlled oscillator 16.

When the next higher available channel on the antenna 11 is properly tuned, providing outputs from both the peak detector 90 and the comparator circuit 84, the monostable multivibrator 100 once again is triggered by an output pulse from the AND gate 92. The flip-flops 64 and 66 then are reset to provide low outputs, and the phase detector circuit portion 44 then maintains tuning of the receiver to this new channel in the manner previously described.

In the circuit which has been described, it is possible to continue to increase the tuning voltage (and frequency) upwardly to the maximum limits of the voltage obtainable from the output of the charge pump 46 and above the tuning range of the highest frequency available channel. Then no lock-up to a channel would occur. To prevent this it is desirable to have some means for resetting the sweep of the voltage controlled oscillator frequency back to a lower limit once the upper limits of the tuning range have been reached. This is accomplished by the use of a switching circuit including a programmable unijunction transistor (PUT) 104 which is provided with a reference or threshold potential from a source of B+ through a resistor 106.

The PUT 104 is coupled to sense the voltage present on the charge storage capacitor 58. When this voltage exceeds the threshold established through the resistor 106, the PUT Is switched on discharging the capacitor 58 rapidly. This also causes a reduction in the base biasing potential applied to the base of an NPN switching transistor 110 to render the normally conductive transistor 110 nonconductive. When this occurs, the potential on the collector of the transistor 110 rises from near ground potential to a positive potential, producing a positive pulse which is applied through the OR gate 102 to the set input of the up flip-flop 64 to cause the output of the flip-flop 64 to be changed from a low to a high value. Substantially simultaneously with this occurrence, the capacitor 58 has been completely discharged and the PUT 104 once again becomes nonconductive re-establishing the initial condition of operation of the switching circuit including the PUT 104 and the transistor 110.

As stated previously, when the flip-flop 64 is set, a high input is applied to the U input of the charge pump 46. Charging of the capacitor 58 then commences to sweep the tuning voltage upwardly which in turn results in the sweep of the frequency of the voltage controlled oscillator 16 from its lowest value upwardly. As soon as the signals for the next channel available on the antenna 11 are properly detected by the peak detector 90 and the comparator circuit 94, the sweep is terminated and the receiver remains tuned to the station selected. This station is the one with lowest frequency capable of reception in the area in which the receiver is used.

From the foregoing it can be seen that selection of different stations is attained by a step-by-step basis by momentarily closing or bridging the contacts of either the up or the down switches 74 and 76, respectively. The circuit automatically seeks the next adjacent available channel after each operation of either of the switches 74 and 76 and automatically tunes to that channel when it is reached. The momentary closing of the switches 74 and 76 can be done by remote control as well as by pushbutton or touch switches located at the receiver. Once a station has been selected by the circuit, tuning to that station is accurately maintained by the phase lock loop tuning circuit.

Since the switching signal applied to the synchronous detector 22 is obtained directly from the output of the stable reference oscillator 48, proper synchronous detector operation is guaranteed even at a relatively low input signal level because the switching signal level is independent of the input signal.

Although the foregoing description has been specifically directed to the use of NOR or OR gate configurations, it will be apparent to those skilled in the art that NAND and AND gate circuit configurations also can be used with appropriate changes in the input signal levels and the output signal levels.

If the connections to the capacitor 58 from the charge pump 46 and to the amplifier 60 are very high impedance connections, it is possible to maintain tuning of the receiver for a long period of time after it is turned off. Then when the receiver is turned back on, it will be tuned to the same channel to which it was tuned the last time it was used. This generally is considered desirable and a charge and discharge circuit interface for a capacitor which is capable of maintaining the charge in this manner is disclosed in Hansen-Reichard, U.S. Pat. No. 3,571,620, issued Mar. 23, 1971.

Although the foregoing description of the system has been directed to the use of a digital phase lock loop, an analog phase lock loop also could be employed, if desired. With an analog loop, the output of the oscillator 48 would need to be shifted 90° relative to the reference signal applied to the analog phase detector because analog phase detectors produce a zero output with a 90° phase difference in the input signals.

In addition, if it is desired to use the system with a mechanical tuner, the switches 74 and 76, flip-flops 64 and 66 and the associated gates and reset circuits could be eliminated. Of course, the signal search function also would not be present if this were done.

We claim:

1. A tuning system for a superheterodyne receiver having a mixer stage, said tuning system including in combination:

a voltage controlled oscillator for supplying tuning signals of varying frequency to the mixer stage in response to a tuning voltage applied thereto;

a phase-lock loop system for supplying a tuning voltage to said voltage controlled oscillator, said loop system including reference oscillator means, and a phase detector stage coupled with the outputs of said reference oscillator means and the mixer stage for producing said tuning voltage; and first and second overriding means coupled with said voltage controlled oscillator for selectively overriding the output of said phase detector stage, each of said first and second overriding means having set and reset stages of operation, said first overriding means in said set state of operation causing the frequency of said voltage controlled oscillator to increase in a predetermined manner and said second overriding means in said set state of operation causing the frequency of said voltage controlled oscillator to decrease in a predetermined manner; and means for independently, selectively changing the states of said first and second overriding means from the reset state of operation to the set state of operation.

2. The combination according to claim 1 wherein said first and second overriding means comprise first and second bistable flip-flop means, respectively, each having a reset and a set state of operation and further including means coupled with the output of the mixer stage for resetting said first ans second flip-flop means to their reset state of operation in response to a predetermined signal level at the output of the mixer stage.

3. The combination according to claim 2 wherein said resetting means comprises automatic gain control circuit means for producing a reset pulse applied to said flip-flop means.

4. A signal seeking tuning system for a superheterodyne television receiver having a mixer with at least two inputs and an output, with received signals applied to one of the inputs thereof and producing a video IF carrier frequency on the output thereof when said receiver is tuned to a transmitted channel, said tuning system including in combination:

voltage controlled oscillator means, with an output coupled to the other input of the mixer and having a control input for receiving a control voltage to vary the frequency of the output signal thereof in response to said control voltage;

reference oscillator means producing an output signal at the desired video IF carrier frequency of the receiver;

phase detector circuit means with a first input coupled with the mixer output and the second input coupled with the output of said reference oscillator means, said phase detector circuit means having at least one output and producing an output signal thereon indicative of the frequency and phase relationship of signals applied to the first and second inputs thereof;

charge storage means;

gating circuit means having first and second outputs coupled with said charge storage means, and coupled to respond to the output of said phase detector circuit means and having at least two additional inputs;

coupling means coupling said charge storage means with said control input of said voltage control oscillator;

first and second normally reset tuning control means having first and second outputs coupled respectively to said two additional inputs of said gating circuit means, each of said tuning control means being selectively settable from a reset state to a set state of operation for producing signals on the outputs of said gating circuit means to increase the charge on said charge storage means when said first tuning control means is changed to its set state of operation and for decreasing the charge on said charge storage means when said second tuning control means is in its set state of operation, thereby overriding the output signal of said phase detector circuit means.

5. The combination according to claim 4 further including means coupled with the output of the mixer and responsive to a predetermined output signal thereof for resetting said tuning control means.

6. The combination according to claim 5 wherein said phase detector circuit means is a digital phase detector with first and second outputs; said gating circuit means comprises first and second gate means each having at least first and second inputs; with the first input of said first and second gate means being coupled respectively with the first and second outputs of said phase detector circuit means; said first and second tuning control means comprise first and second flip-flop means respectively, with the output of said first flip-flop means being connected respectively with the second input of said first gate means and the output of said second flip-flop means being connected with the second input of said second gate means, and further comprise means for selectively changing the state of each of said first and second flip-flop means from a reset condition to a set condition to change the state of the output thereof accordingly; and the outputs of said first and second gate means are coupled with said charge storage means to control the charge stored thereon.

7. The combination according to claim 6 wherein said resetting means resets said first and second flip-flop means from a set state to a reset state.

8. The combination according to claim 7 wherein said receiver includes an IF amplifier connected to the output of the mixer and said resetting means comprises means coupled with the output of the IF amplifier and responsive to the magnitude of signal appearing on such output for resetting said first and second flip-flop means in response to a signal in excess of a predetermined magnitude.

* * * * *